(12) United States Patent
Chen et al.

(10) Patent No.: US 7,301,185 B2
(45) Date of Patent: Nov. 27, 2007

(54) HIGH-VOLTAGE TRANSISTOR DEVICE HAVING AN INTERLAYER DIELECTRIC ETCH STOP LAYER FOR PREVENTING LEAKAGE AND IMPROVING BREAKDOWN VOLTAGE

(75) Inventors: Chung-I Chen, Hsinchu (TW); Hsin Kuan, Hsinchu (TW); Zhi-Cheng Chen, Hsinchu (TW); Rann-Shyan Yeh, Hsin-Chu (TW); Chi-Hsuen Chang, Hsinchu (TW); Jun Xiu Liu, Hsinchu (TW); Tzu-Chiang Sung, Jhubei (TW); Chia-Wei Liu, Huatan Township (TW); Jieh-Ting Cheng, Nantou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 310 days.

(21) Appl. No.: 10/999,508

(22) Filed: Nov. 29, 2004

(65) Prior Publication Data

US 2006/0113627 A1    Jun. 1, 2006

(51) Int. Cl.
*H01L 27/148* (2006.01)
*H01L 29/80* (2006.01)
*H01L 21/824* (2006.01)

(52) U.S. Cl. .................... 257/255; 257/256; 438/239; 438/249

(58) Field of Classification Search ............... 257/255, 257/256; 438/239, 240, 249
See application file for complete search history.

(56) References Cited

U.S. PATENT DOCUMENTS

| 6,074,908 | A | * | 6/2000 | Huang | ........................ 438/241 |
| 6,235,653 | B1 | | 5/2001 | Chen et al. | |
| 6,316,348 | B1 | | 11/2001 | Fu et al. | |
| 6,468,870 | B1 | | 10/2002 | Kao et al. | |
| 6,492,222 | B1 | * | 12/2002 | Xing | ........................ 438/240 |
| 6,576,546 | B2 | * | 6/2003 | Gilbert et al. | ............... 438/629 |
| 6,630,398 | B2 | * | 10/2003 | Tsai et al. | .................... 438/637 |
| 2006/0097321 | A1 | * | 5/2006 | Kim | ............................ 257/355 |

OTHER PUBLICATIONS

INSPEC Abstract No. B9412-5230-025 Jul.-Aug. 1994.*

* cited by examiner

*Primary Examiner*—Howard Weiss
*Assistant Examiner*—Shrinivas H. Rao
(74) *Attorney, Agent, or Firm*—Slater & Matsil, L.L.P.

(57) ABSTRACT

A high-voltage transistor device with an interlayer dielectric (ILD) etch stop layer for use in a subsequent contact hole process is provided. The etch stop layer is a high-resistivity film having a resistivity greater than 10 ohm-cm, thus leakage is prevented and breakdown voltage is improved when driving a high voltage greater than 5V at the gate site. A method for fabricating the high-voltage device is compatible with current low-voltage device processes and middle-voltage device processes.

11 Claims, 7 Drawing Sheets

HIGH-VOLTAGE TRANSISTOR DEVICE HAVING AN INTERLAYER DIELECTRIC ETCH STOP LAYER FOR PREVENTING LEAKAGE AND IMPROVING BREAKDOWN VOLTAGE

TECHNICAL FIELD

The present invention relates to transistor devices for high-voltage applications, and particularly to a high-voltage transistor device with an interlayer dielectric (ILD) etch stop layer for preventing leakage and improving breakdown voltage.

BACKGROUND

High-voltage devices are highly desirable for numerous applications, including LCD (liquid crystal display) driver ICs, power management devices, power supplies, nonvolatile memories, communication circuits, and control circuits. Particularly, the LCD driver IC requires low-voltage/middle-voltage operation for driving an associated logic circuit together with high-voltage operation for driving the LCD during operation. Since devices with different breakdown voltages are required on a single chip, making the high-voltage device process compatible with current low-voltage device processes and middle-voltage device processes has become an important issue.

In general, most high-voltage metal-oxide-semiconductor (MOS) transistors thicken an isolating layer between the gate and the source/drain regions as a means of lowering the horizontal electric field within the channel. Alternatively, drift regions below the isolation layer and the graded regions beneath source/drain regions are lightly doped to provide the necessary voltage gradient. The two above measures are capable of increasing junction breakdown voltage in the source/drain regions so that the MOS transistor is able to operate normally despite the application of a high voltage, e.g., greater than 5V. One type of high-voltage transistors is DDDMOS (double diffused drain MOS) transistors, which are grouped into VDMOS (vertical DMOS) transistors and LDMOS (lateral DMOS) transistors according to the direction of the current path. U.S. Pat. No. 6,468,870 to Kao, et al. incorporated herein by reference describes a method of fabricating an LDMOS transistor with an inter-level dielectric layer.

Conventionally, the source/drain regions are electrically connected to an upper conductive layer that fills a contact hole fabricated in an interlayer dielectric (WLD) layer. It is frequently desired to form an etch stop layer over circuit constructions so that subsequent etching conditions for the contact hole do not damage the circuit constructions. U.S. Pat. No. 6,630,398 to Tsai, et al. incorporated herein by reference describes a borderless contact with a silicon oxynitride etch stop layer. U.S. Pat. No. 6,235,653 to Chien, et al. and U.S. Pat. No. 6,316,348 to Fu, et al. incorporated herein by reference describe a silicon-rich oxynitride film having a silicon molar percentage between about 58% and 62% for an etch stop layer. Such a silicon-rich SiON film is insufficient for buffer isolation in high-voltage device applications because the silicon-rich SiON film generates an extra leakage path through which leakage current flows. The extra leakage path causes a large leakage current from the gate to the source and thereby lowers the gate oxide breakdown voltage. Chip reliability tests reveal that a silicon-rich SiON etch stop layer integrated into high-voltage MOS transistors fails in GOI (gate oxide integrity) tests and introduces a time dependence of drain current.

SUMMARY OF THE INVENTION

Embodiments of the present invention include high-voltage transistor devices having an interlayer dielectric (ILD) etch stop layer which has a resistivity greater than 10 ohm-cm so as to prevent leakage and improve breakdown voltage.

In one aspect, the present invention provides a semiconductor device and a fabricating method thereof for a high-voltage transistor device. A gate structure is formed overlying a high-voltage device region of a semiconductor substrate. At least one diffusion region is formed in said high-voltage region of said semiconductor substrate and laterally aligned to a sidewall of said gate structure. An etch stop layer is formed overlying said gate structure and said at least one diffusion region, wherein said etch stop layer has a resistivity greater than 10 ohm-cm. An interlayer dielectric layer is formed overlying said etch stop layer, wherein at least one contact hole penetrates said interlayer dielectric layer and said etch stop layer to expose said at least one diffusion region. The etch stop layer is selected from any dielectric material other than silicon-rich SiON.

In another aspect, the present invention provides a high-voltage transistor device comprising: a semiconductor substrate having a first conductive-type well and second conductive-type well laterally adjacent to said first conductive-type well; a gate structure overlying said semiconductor substrate, wherein two sidewalls of said gate structure are covered with a first dielectric spacer and a second dielectric spacer, respectively; a source region formed in said first conductive-type well, wherein the margin of said source region is substantially aligned to an exterior sidewall of said first dielectric spacer; a drain region formed in said second conductive-type well, wherein the margin of said drain region is substantially aligned to an exterior sidewall of said second dielectric spacer; an LDD region formed in said first conductive-type well and extending laterally from said source region, wherein the margin of said LDD region is substantially aligned to the sidewall of said gate structure; a trench isolation structure in said second conductive-type well and laterally adjacent to said drain region, wherein said gate structure covers a portion of said trench isolation structure; an etch stop layer overlying said gate structure, said source region and said drain region, wherein said etch stop layer has a resistivity greater than 10 ohm-cm; and an interlayer dielectric layer overlying said etch stop layer, wherein two contact holes penetrate said interlayer dielectric layer and said etch stop layer to expose said source region and said drain region, respectively.

In another aspect, the present invention provides a high-voltage transistor device, comprising: a semiconductor substrate having a first well and a second well laterally separated from each other, wherein said first well and said second well have the same conductive type; a gate structure overlying said semiconductor substrate, wherein two sidewalls of said gate structure are covered with a first dielectric spacer and a second dielectric spacer, respectively; a source region formed in said first well, wherein the margin of said source region is substantially aligned to an exterior sidewall of said first dielectric spacer; a drain region formed in said second well, wherein the margin of said drain region is substantially aligned to an exterior sidewall of said second dielectric spacer; a first trench isolation structure in said first well and laterally adjacent to said source region, wherein said gate structure covers a portion of said first trench isolation structure; a second trench isolation structure in said second well and laterally adjacent to said drain region, wherein said gate structure covers a portion of said second trench isolation structure; an etch stop layer overlying said gate structure, said source region and said drain region, wherein said etch stop layer has a resistivity greater than 10 ohm-cm; and an interlayer dielectric layer overlying said etch stop layer, wherein two contact holes penetrate said interlayer dielectric layer and said etch stop layer to expose said source region and said drain region, respectively.

In another aspect, the present invention provides a high-voltage transistor device, comprising: a gate structure overlying a semiconductor substrate, wherein two sidewalls of said gate structure are covered with a first dielectric spacer and a second dielectric spacer, respectively; a source region formed in said semiconductor substrate, wherein the margin of said source region is substantially aligned to an exterior sidewall of said first dielectric spacer; a drain region formed in said semiconductor substrate, wherein the margin of said drain region is substantially aligned to an exterior sidewall of said second dielectric spacer; an LDD region formed in said semiconductor substrate and extending laterally from said source region, wherein the margin of said LDD region is substantially aligned to the sidewall of said gate structure; a diffusion extending region formed in said semiconductor substrate and surrounding said drain region, wherein said gate structure covers a portion of said diffusion extending region; an etch stop layer overlying said gate structure, said source region and said drain region, wherein said etch stop layer has a resistivity greater than 10 ohm-cm; and an interlayer dielectric layer overlying said etch stop layer, wherein two contact holes penetrate said interlayer dielectric layer and said etch stop layer to expose said source region and said drain region, respectively.

In another aspect, the present invention provides a high-voltage transistor device, comprising: a gate structure overlying a semiconductor substrate, wherein two sidewalls of said gate structure are covered with a first dielectric spacer and a second dielectric spacer, respectively; a source region formed in said semiconductor substrate, wherein the margin of said source region is substantially aligned to an exterior sidewall of said first dielectric spacer; a drain region formed in said semiconductor substrate, wherein the margin of said drain region is substantially aligned to an exterior sidewall of said second dielectric spacer; a first diffusion extending region formed in said semiconductor substrate and surrounding said source region, wherein said gate structure covers a portion of said first diffusion extending region; a second diffusion extending region formed in said semiconductor substrate and surrounding said drain region, wherein said gate structure covers a portion of said second diffusion extending region; an etch stop layer overlying said gate structure, said source region and said drain region, wherein said etch stop layer has a resistivity greater than 10 ohm-cm; and an interlayer dielectric layer overlying said etch stop layer, wherein two contact holes penetrate said interlayer dielectric layer and said etch stop layer to expose said source region and said drain region, respectively.

BRIEF DESCRIPTION OF THE DRAWINGS

The aforementioned features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
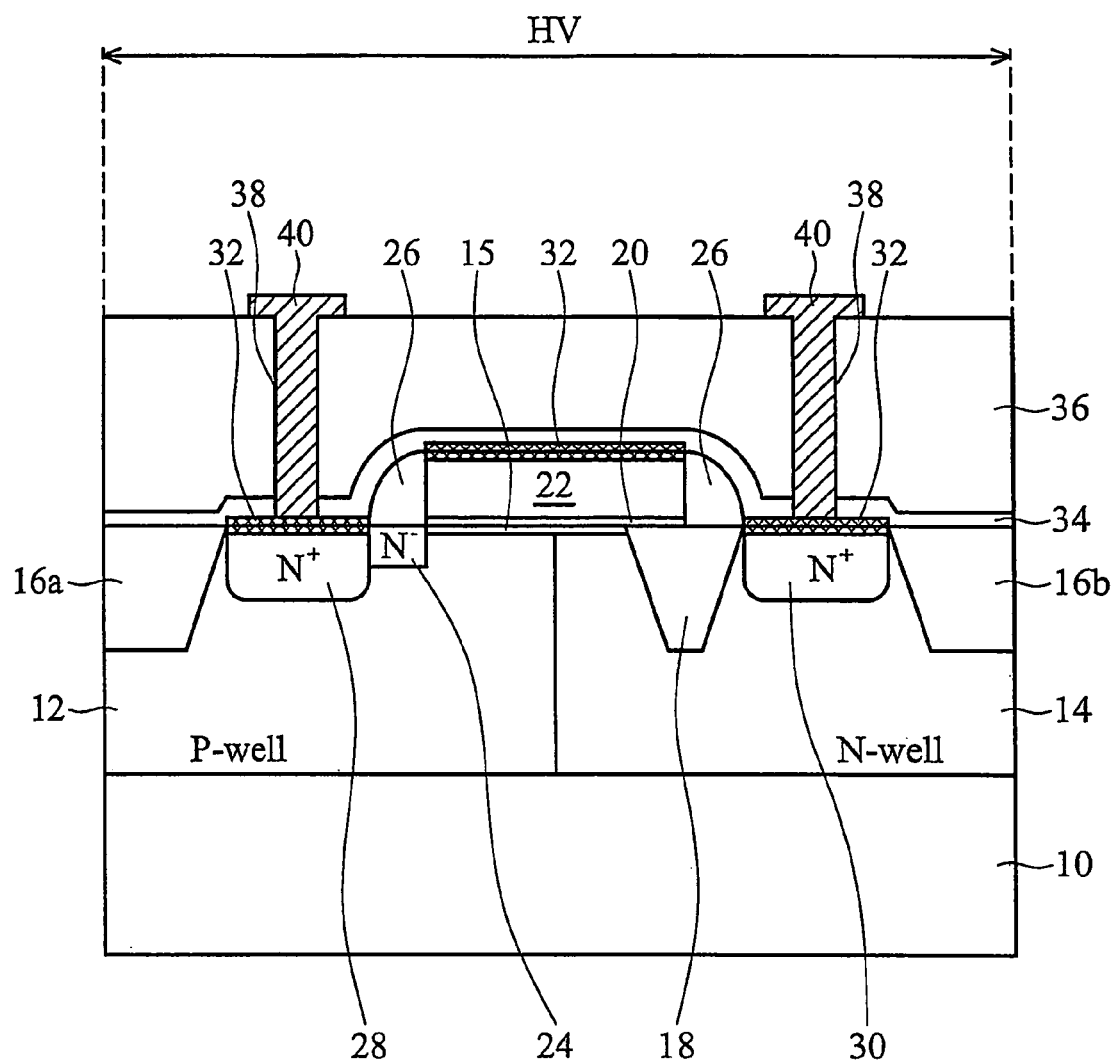
FIG. 1 is a cross-sectional diagram illustrating an exemplary embodiment of an asymmetric-type NMOS device according to the present invention.

Preferred embodiments of the present invention provide high-voltage transistor devices with an interlayer dielectric (ILD) etch stop layer for use in a subsequent contact hole process. The etch stop layer of the preferred embodiments is selected from any dielectric material other than silicon-rich SiON, which overcomes the aforementioned problems of the prior art arising from the use of a silicon-rich SiON etch stop layer. Particularly, the invention provides a high-resistivity dielectric film having a resistivity greater than 10 ohm-cm as an etch stop layer beneath an ILD layer for fabricating a contact hole in a high-voltage device process, which achieves desired buffer isolation to prevent leakage when driving a high voltage e.g., greater than 5V, at the gate site of the high-voltage transistor device. The high-resistivity dielectric film can suppress an extra leakage path from gate site to source site, and the gate oxide breakdown voltage can therefore be improved to pass the GOI test and solve time dependency issues. The high-voltage device process of the invention is also compatible with current low-voltage device processes and middle-voltage device processes since the back-end steps are substantially the same as in generic processes.

As used throughout this disclosure, the term "etch stop" refers to a layer which is deposited on or intermediately in a layer, and is of a different material than a layer overlying the etch stop, and preferably has characteristics which render its etch rate much slower than that of the material overlying it. The result is that the etch stop provides a clear indicator of when to end a particular etching process. In one embodiment of the invention, the etch stop layer is a single layer of silicon nitride ($Si_xN_y$), wherein x and y are variables standing for the atom composition ratio, hereinafter merely referred to as "SiN". Despite the nomenclature employed, it is understood that a component of the film, possibly a substantial component, is hydrogen, depending upon the deposition process and parameters used to form the SiN film. In another embodiment of the invention, the etch stop layer is a composite layer comprising silicon oxide and SiN. In still another embodiment of the invention, the etch stop layer is a non-silicon-rich silicon oxynitride layer, hereinafter referred to as "non-silicon-rich $Si_xO_yN_z$", wherein x, y and z are variables standing for the atom composition ratio, hereinafter merely referred to as "non-silicon-rich SiON". Again, hydrogen might also be a component of the film. As used throughout this disclosure, the term "non-silicon-rich SiON" refers to a SiON film having a silicon molar percentage smaller than about 55%. For example, in one embodiment of the invention, the atom composition ratio of silicon to oxygen to nitrogen in the non-silicon-rich SiON film is about 12:21:42. Comparatively, in the conventional high-voltage device, the atom composition ratio of silicon to oxygen to nitrogen in the silicon-rich SiON film is about 158:72:144.

As used throughout this disclosure, the term "high-voltage transistor device" refers to a MOS transistor operating at a power supply voltage greater than 5V, typically within the range of 10V to 80V. The invention has wide applicability to many manufacturers, factories and industries, including, but not limited to, integrated circuit fabrication, microelectronic fabrication, and optical electronic fabrication for numerous high-voltage applications, such as LCD driver ICs, power management devices, power supplies, nonvolatile memories, communication circuits, and control circuits. Particularly, the invention provides high-voltage MOS transistor optimization for LCD driver technology from 12V to 60V applications. The invention may adopt STI (shallow trench isolation) techniques or LOCOS (local oxidation of silicon) isolation techniques to fabricate either asymmetric-type high-voltage MOS transistors or symmetric-type high-voltage MOS transistors, wherein the high-voltage MOS transistor configurations include DDDMOS transistors, LDMOS transistors and VDMOS transistors according to the direction of the current path.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, a cross-sectional diagram of FIG. 1 illustrates an exemplary embodiment of an asymmetric-type NMOS device according to the present invention. A semiconductor substrate 10, preferably a P-type silicon substrate, comprises a P-well 12 and an N-well 14 formed in an active area of a high-voltage device region HV. The semiconductor substrate 10 includes, but is not limited to, silicon, silicon on insulator (SOI), SiGe on insulator, or combinations thereof. Suitable dopants to form the P-well 12 include boron (B) and $BF_2$ with a dosage of about $6.0 \times 10^{12}$ ion/$cm^2$ to $9.0 \times 10^{12}$ ion/$cm^2$. Suitable dopants to form the N-well 14 include arsenic (As), antimony (Sb) and phosphorous (P) with a dosage of about $6.0 \times 10^{12}$ ion/cm to $9.0 \times 10^{12}$ ion/$cm^2$. Also, threshold-voltage adjustment ions for the high-voltage transistor region are implanted into the semiconductor substrate 10, resulting in a threshold voltage adjustment region 15. STI structures 16a and 16b are formed in the semiconductor substrate 10 to define the active area of the high-voltage device region HV. An additional STI structure 18 is formed in a portion of the active area of the semiconductor substrate 10. Preferably, the STI structure 18 is formed in the N-well 14 and resides at a drain side of gate that will be described in detail below. The STI structures 16a, 16b and 18 may be created with conventionally well-known approaches, and therefore a description thereof will be omitted.

A gate structure comprising a gate dielectric layer 20 and a gate electrode layer 22 is formed over a portion of the active area of the semiconductor substrate 10, which may use conventional deposition, lithographic patterning and dry etching methods known in the art. The drain side of the gate structure is over a portion of the STI structure 18 and an adjacent portion of the N-well 14. The gate dielectric layer 20 may be formed of silicon oxide, silicon oxynitride, silicon nitride, high-k dielectrics (e.g., k>4.0), transition metal oxides, and rare earth metal oxides by using any process known in the art, e.g., thermal oxidation and chemical vapor deposition (CVD). The thickness of the gate dielectric layer 20 is chosen specifically for the scaling requirements of the high-voltage device technology. The gate electrode layer 22 may be formed of polysilicon, amorphous polysilicon, doped polysilicon, polysilicon-germanium, metal, or combinations thereof by using CVD, sputtering or thermal growth processes.

A lightly doped ion implantation process is performed with various dopant species into the semiconductor substrate 10 to form an LDD (lightly doped drain) region 24, preferably an $N^-$ region, located in the P-well 12. The margin of the LDD region 24 is substantially aligned to the sidewall of the gate structure. The lightly doped ion implantation process may be performed at an energy between about 1 to about 100 KeV, at a dosage of between about $1 \times 10^{13}$ to about $1 \times 10^{15}$ ions/$cm^2$. Advances in deposition, lithography, masking techniques and dry etch processes are followed to form dielectric spacers 26 along the sidewalls of the gate structure. The dielectric spacers 26 may be formed of a silicon nitride layer, a silicon oxide layer, a silicon oxynitride layer, alternating layers of silicon oxide and silicon nitride, or combinations thereof. A heavily doped ion implantation process is then performed and the dielectric spacers 26 are used as a mask to implant various dopant species into the semiconductor substrate 10, resulting in $N^+$ regions which function as a source region 28 and a drain region 30 in the P-well 12 and the N-well 14, respectively. The margins of the source region 28 and the drain region 30 are substantially aligned to the exterior sidewalls of the dielectric spacers 26, respectively. The drain region 30 is formed in the N-well 14 between the STI structures 18 and 16b, and separated from the drain side of the gate structure by an appropriate distance. The heavily doped ion implantation process may be performed at an energy between about 1 to 100 KeV, at a dosage between about $5 \times 10^{13}$ to $1 \times 10^6$ ions/$cm^2$. An optional metal silicide layer 32 using a refractory metal such as cobalt, tungsten, titanium, nickel or the like may be formed on the surface of the gate electrode layer 22, the surface of the source region 28 and the surface of the drain region 30 to lower their resistance values.

Once the high-voltage transistor is completed, an etch stop layer 34 is deposited over the semiconductor substrate 10. The etch stop layer 34 is selected from any dielectric material other than silicon-rich SiON. Particularly, the etch stop layer 34 is a high-resistivity film having a resistivity greater than 10 ohm-cm, which achieves the desired buffer isolation to suppress an extra leakage path when driving a high voltage e.g., greater than 5V, at the gate site. In one embodiment of the invention, the etch stop layer 34 is a SiN layer by using any of a variety of deposition techniques, including, LPCVD (low-pressure chemical vapor deposition), PECVD (plasma-enhanced chemical vapor deposition) and future-developed deposition procedures. More specifically, the SiN layer may be deposited using a reactant gas mixture of $SiH_4$, $NH_3$, $SiCl_2H_2$ or $N_2$, at a pressure between about 200 mTorr and 400 mTorr, at a temperature between about 300° C. and 800° C., to reach a thickness of from about 100 angstroms to about 1000 angstroms.

In another embodiment of the invention, the etch stop layer 34 comprises a silicon oxide layer and a SiN layer. The silicon oxide layer may be deposited using any of a variety of techniques, including, thermal oxidation, LPCVD, PECVD and future-developed deposition procedures. More specifically, the silicon oxide layer may be deposited using the PECVD procedure with a reactant gas mixture of $SiH_4$ and $N_2O$. The silicon oxide layer may also be grown using an LPCVD procedure, at a temperature between about 700° C. and 950° C., to reach a thickness of from about 10 angstroms to about 1000 angstroms. In one embodiment of using a composite etch stop layer, a silicon oxide layer is laminated thereto a silicon nitride layer. In another embodiment of using a composite etch stop layer, a silicon nitride layer is laminated thereto a silicon oxide layer. The thickness of the silicon oxide layer and the thickness of the silicon nitride layer are chosen specifically for dielectric requirements.

In still another embodiment of the invention, the etch stop layer 34 is a non-silicon-rich SiON layer having a silicon molar percentage smaller than about 55%. The non-silicon-rich SiON layer may be deposited using any of a variety of techniques, including, LPCVD, PECVD and future-developed deposition procedures. A practical application uses the non-silicon-rich SiON layer deposited by PECVD with a reactant gas mixture of $N_2O$, $SiH_4$, He or $NH_3$ and at a temperature between about 300° C. and 600° C. to reach a thickness of from about 100 angstroms to about 1000 angstroms.

An ILD layer 36 is deposited on the etch stop layer 34 and is then polished by applying chemical mechanical polishing (CMP), if necessary. The ILD layer 36 may include, but is not limited to, silicon dioxide, undoped silicate glass (USG), fluorinated silicate glass (FSG), fluorine-doped tetraethylorthosilicate (FTEOS), Hydrogen-Silsesquioxane (HSQ), and the like of low-k materials (e.g., dielectric constant value k<4.0). The ILD layer 36 has a thickness of between about 3000 angstroms and 8000 angstroms.

After the ILD formation, contact holes 38 are formed to provide local interconnects which will be filled with a conductive material 40 for electrical connection to the source region 28 and the drain region 30. The contact holes 38 may be formed using a typical lithographic and etch operation. For example, a photoresist layer (not shown) is applied to the ILD layer 36, exposed to impart a latent image pattern characteristic of the contact holes 38, and developed to transform the latent image pattern into a final image pattern that defines masked areas and unmasked areas on the ILD layer 36 at the locations of the contact holes 38. Then, portions of the ILD layer 36 are removed from unmasked areas by a main etch process through any suitable etching process, such as anisotropic etching (e.g., plasma etching or reactive ion etching), that has a very low etch rate for the etch stop layer 34 and stops thereupon. When the ILD layer 36 uses USG or FSG, the main etch procedure uses an etchant including $C_4F_8$ of 10~20 sccm, $C_2F_6$ of 10~20 sccm, CO of 30~50 sccm and Ar.

Portions of the etch stop layer 34 are removed from unmasked areas by a secondary etch process without damage to the ILD layer 36 and the metal silicide layer 32. The secondary etch process is an anisotropic etching using etchant gases including $O_2$, $C_2F_6$, $C_4F_8$, $CH_2F_2$ and He, at a pressure between about 10~200 mTorr with an etch time between 10~80 seconds. The contact holes 38 are therefore completed in the ILD layer 36 and the etch stop layer 34 to expose the metal silicide layer 32 over the source region 28 and the drain region 30, and the patterned photoresist layer is then stripped.

Figure 2:
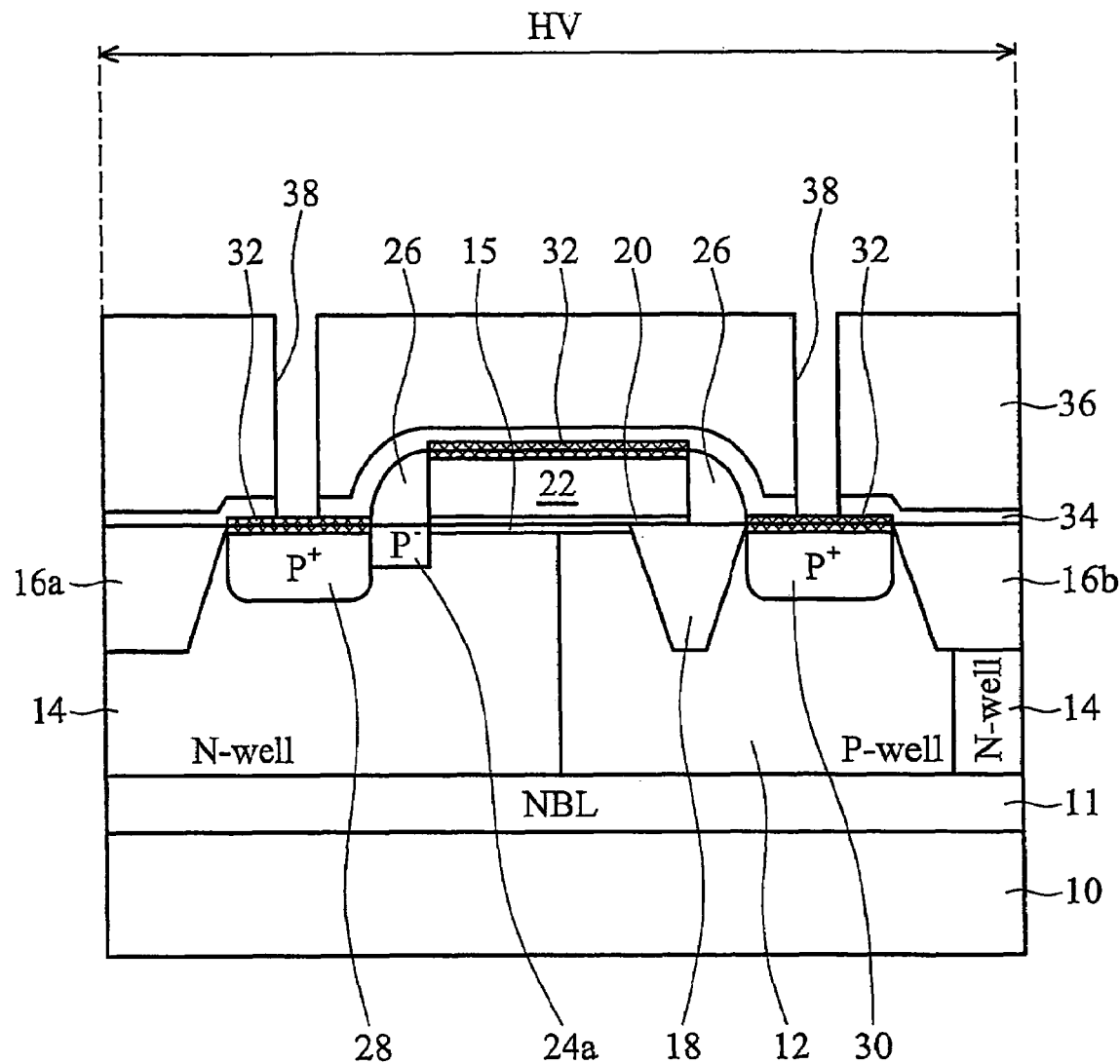
FIG. 2 is a cross-sectional diagram illustrating an exemplary embodiment of an asymmetric-type PMOS device according to the present invention.

FIG. 2 is a cross-sectional diagram illustrating an exemplary embodiment of an asymmetric-type PMOS device according to the present invention, while explanation of the same or similar portions to the description in FIG. 1 will be omitted. Compared with the asymmetric-type NMOS device, the asymmetric-type PMOS device fabricated on the active area of the high-voltage device region HV further comprises an N-type buried layer (NBL) 11 underlying the N-well 14 and the P-well 12, wherein the LDD region 24 is a P⁻ region formed in the N-well 14, the source region 28 is a P⁺ region formed in the N-well 14, and the drain region 30 is a P⁺ region formed in the P-well 12.

Figure 3:
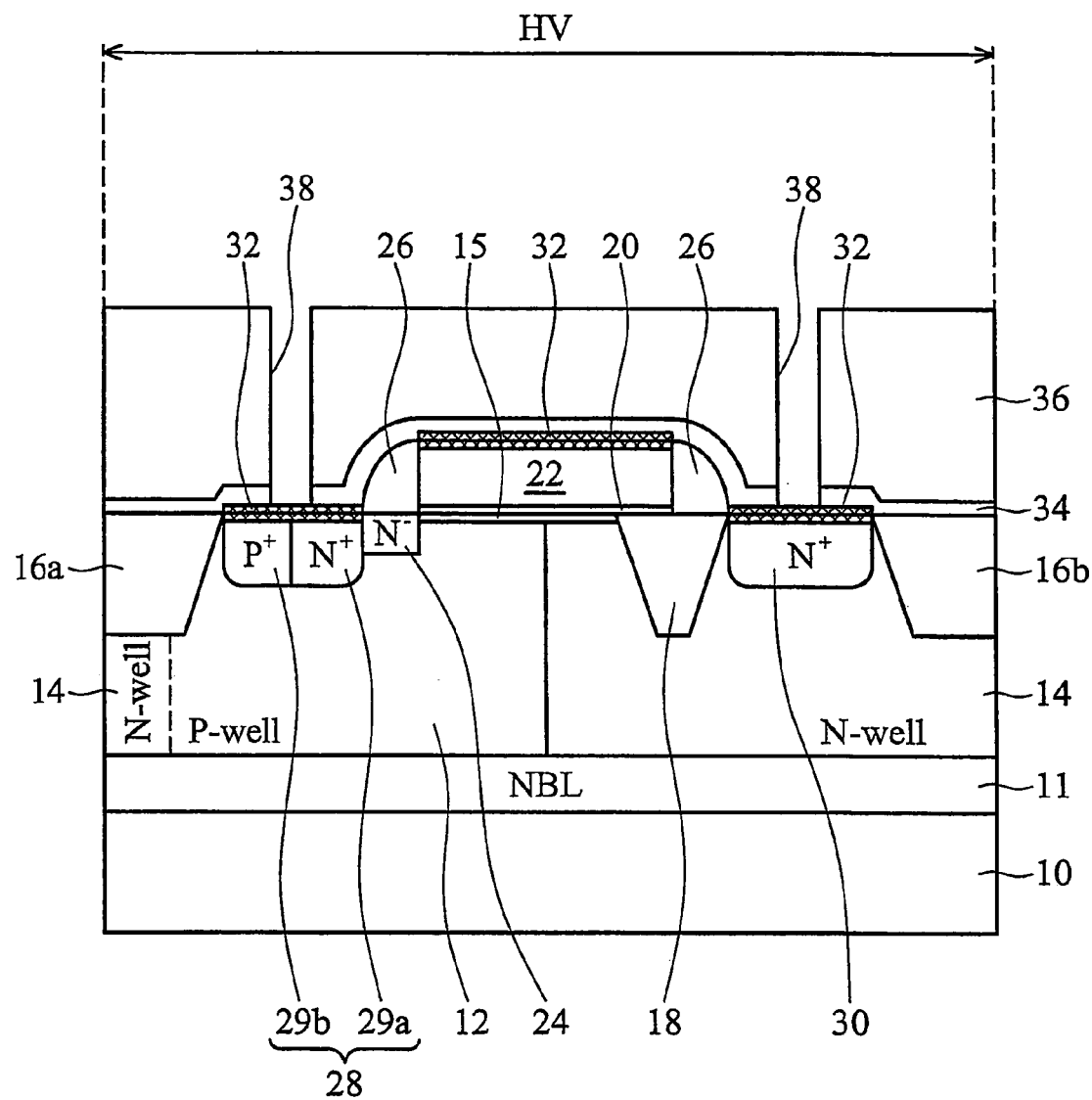
FIG. 3 is a cross-sectional diagram illustrating an exemplary embodiment of an isolated-type NMOS device according to the present invention.

FIG. 3 is a cross-sectional diagram illustrating an exemplary embodiment of an isolated-type NMOS device according to the present invention, while explanation of the same or similar portions to the description in FIG. 1 will be omitted. Compared with the asymmetric-type NMOS device, the isolated-type NMOS device fabricated on the active area of the high-voltage device region HV further comprises an N-type buried layer (NBL) 11 underneath the P-well 12 and the N-well 14, wherein the source region 28 comprises an N⁺ region 29*a* and a P⁺ region 29*b*.

Figure 4:
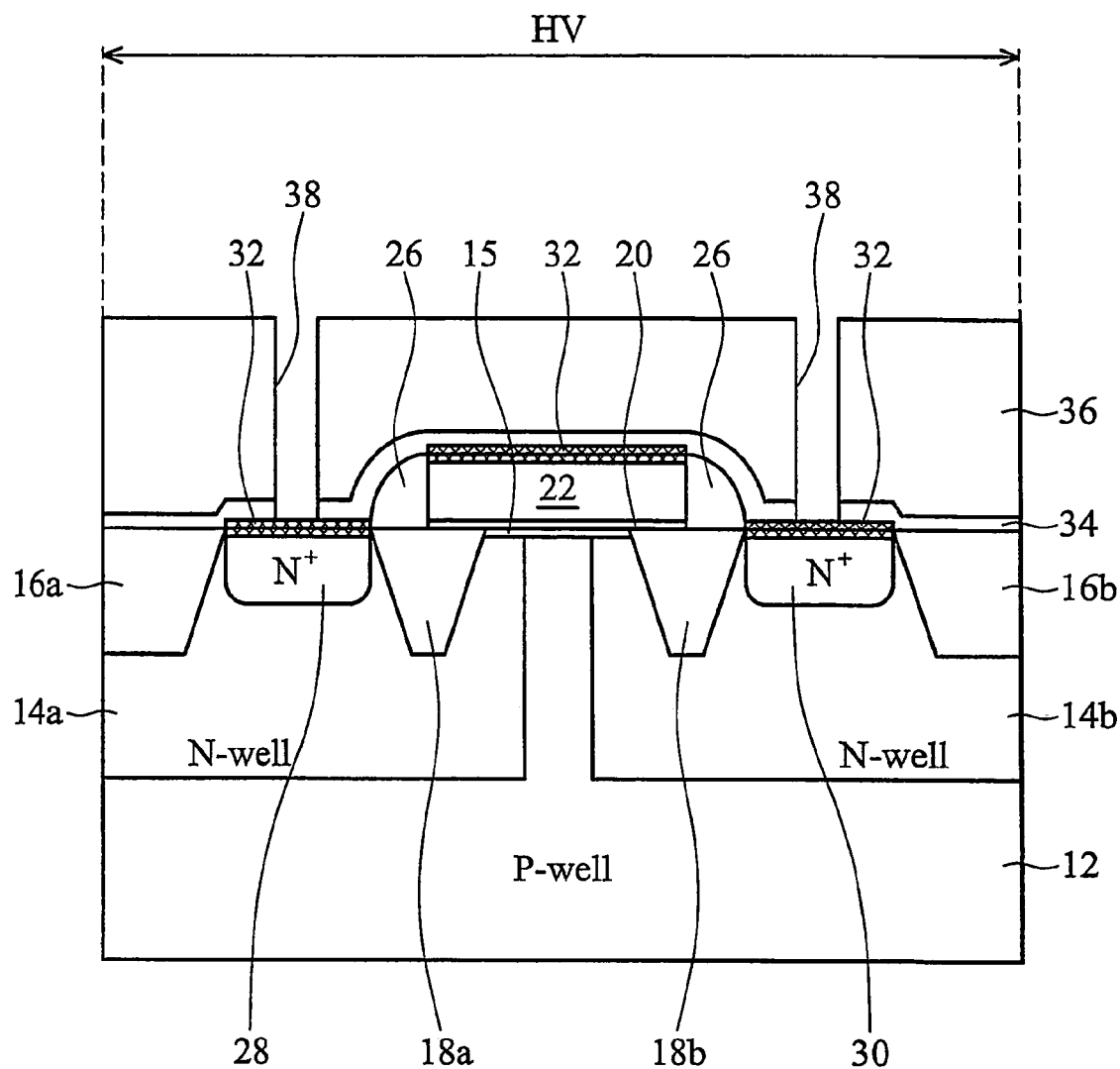
FIG. 4 is a cross-sectional diagram illustrating an exemplary embodiment of a symmetric-type NMOS device according to the present invention.

FIG. 4 is a cross-sectional diagram illustrating an exemplary embodiment of a symmetric-type NMOS device according to the present invention, while explanation of the same or similar portions to the description in FIG. 1 will be omitted. Compared with the asymmetric-type NMOS device, the symmetric-type NMOS device fabricated on the active area of the high-voltage device region HV comprises two N-wells 14*a* and 14*b* separated from a P-well 12, and two STI structures 18*a* and 18*b* formed in two separated N-wells 14*a* and 14*b*, respectively. The source side of the gate structure is over a portion of the STI structure 18*a* and an adjacent portion of the N-well 14*a*, and the drain side of the gate structure is over a portion of the STI structure 18*b* and an adjacent portion of the N-well 14*b*.

Figure 5:
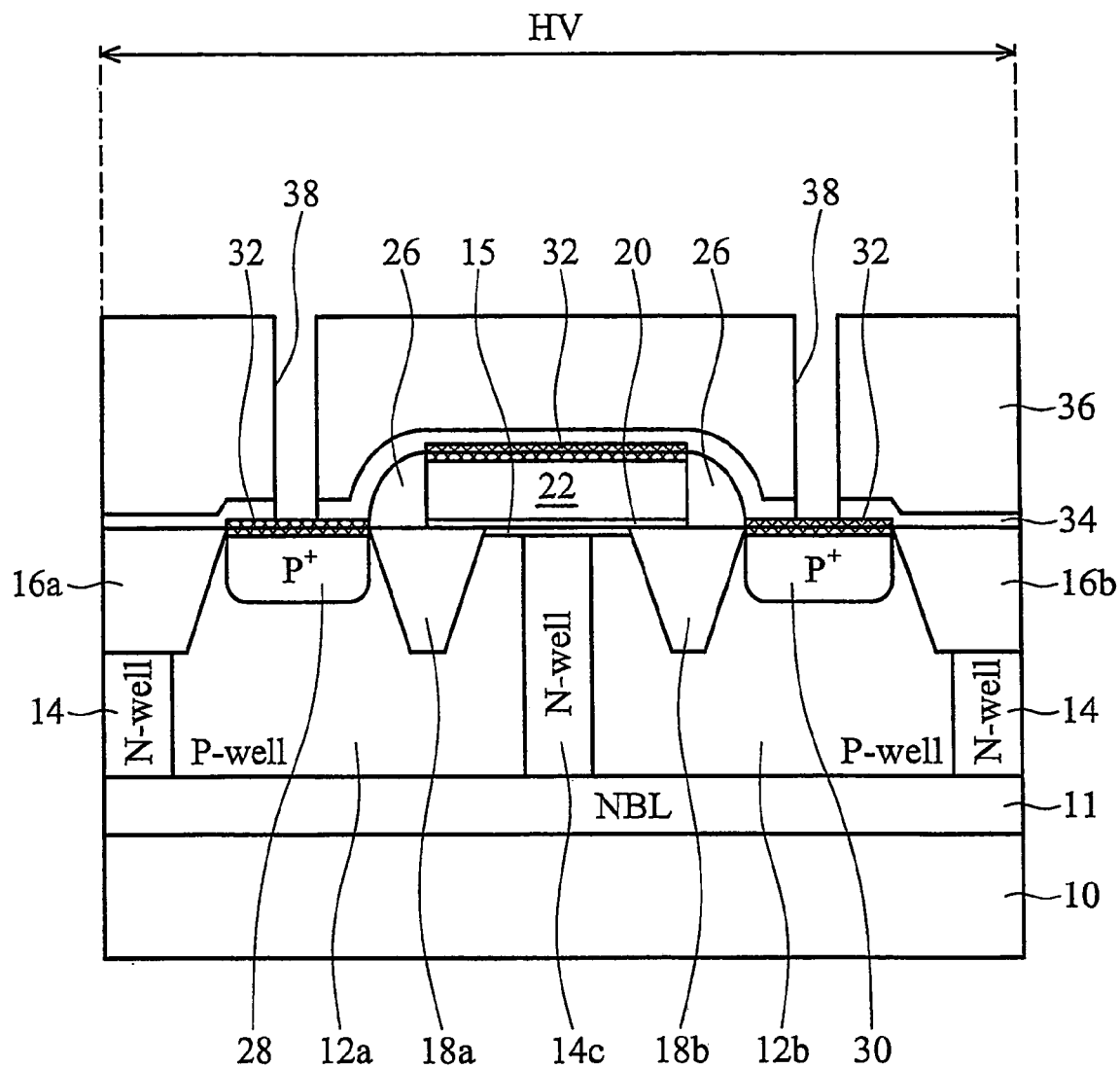
FIG. 5 is a cross-sectional diagram illustrating an exemplary embodiment of a symmetric-type PMOS device according to the present invention.

FIG. 5 is a cross-sectional diagram illustrating an exemplary embodiment of a symmetric-type PMOS device according to the present invention, while explanation of the same or similar portions to the description in FIG. 2 will be omitted. Compared with the asymmetric-type PMOS device, the symmetric-type PMOS device fabricated on the active area of the high-voltage device region HV comprises two STI structures 18*a* and 18*b* formed in two separated P-wells 12*a* and 12*b*, respectively. An additional N-well 14*c* is sandwiched between the two P-wells 12*a* and 12*b*. The source side of the gate structure is over a portion of the STI structure 18*a* and an adjacent portion of the P-well 12*a*, and the drain side of the gate structure is over a portion of the STI structure 18*b* and an adjacent portion of the P-well 12*b*.

Figure 6:
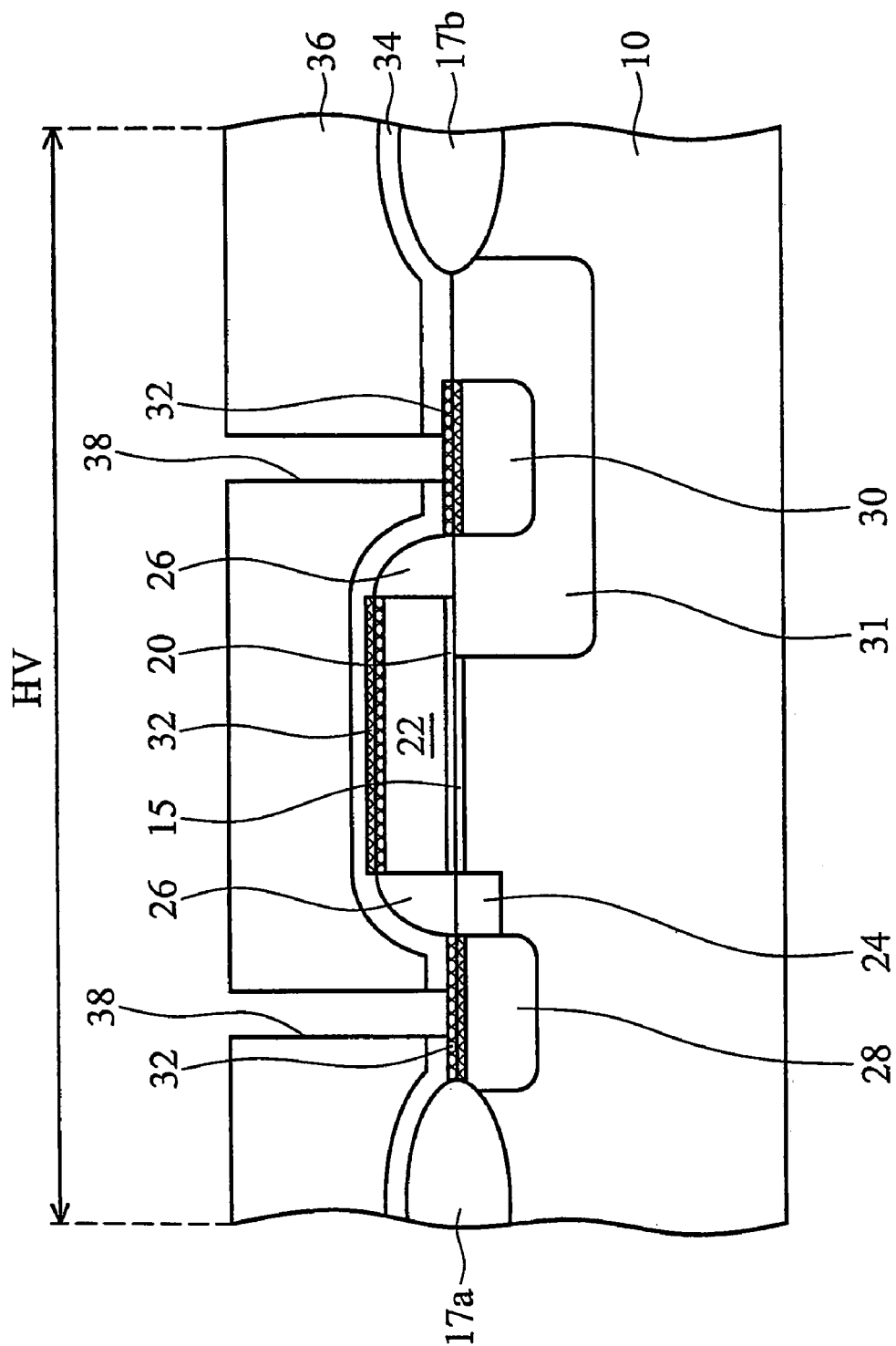
FIG. 6 is a cross-sectional diagram illustrating an exemplary embodiment of an asymmetric-type DDDMOS transistor according to the present invention.

FIG. 6 is a cross-sectional diagram illustrating an exemplary embodiment of an asymmetric-type DDDMOS transistor according to the present invention, while explanation of the same or similar portions to the description in FIG. 1 will be omitted. Compared with an asymmetric-type LDMOS transistor, the asymmetric-type DDDMOS transistor comprises two field oxide regions 17*a* and 17*b* formed in the semiconductor substrate 10 to define the active area of the high-voltage device region HV. The field oxide regions 17*a* and 17*b* may be created with a conventionally well-known LOCOS isolation technique, and therefore a description thereof will be omitted. A diffusion extension region 31, adjacent to the drain side of the gate structure, surrounds the drain region 30 to construct a double diffused drain region. The diffusion extension region 31 has a relatively larger area with a relatively light dosage, and the drain region 30 has a relatively smaller area with a relatively heavy dosage. As based for an NMOS transistor, the diffusion extension region 31 is an N⁻ region with a dosage of about $6.0\times10^{12}$ ions/cm² to $9.0\times10^{12}$ ions/cm², and the drain region 30 and the source region 28 are N⁺ regions with a dosage of about $5\times10^{13}$ to $1\times10^{16}$ ions/cm². As based for a PMOS transistor, the diffusion extending region 31 is a P⁻ region with a dosage of about $6.0\times10^{12}$ ions/cm² to $9.0\times10^{12}$ ions/cm², the drain region 30 and the source region 28 are P⁺ regions with a dosage of about $5\times10^{13}$ to $1\times10^{16}$ ions/cm².

Figure 7:
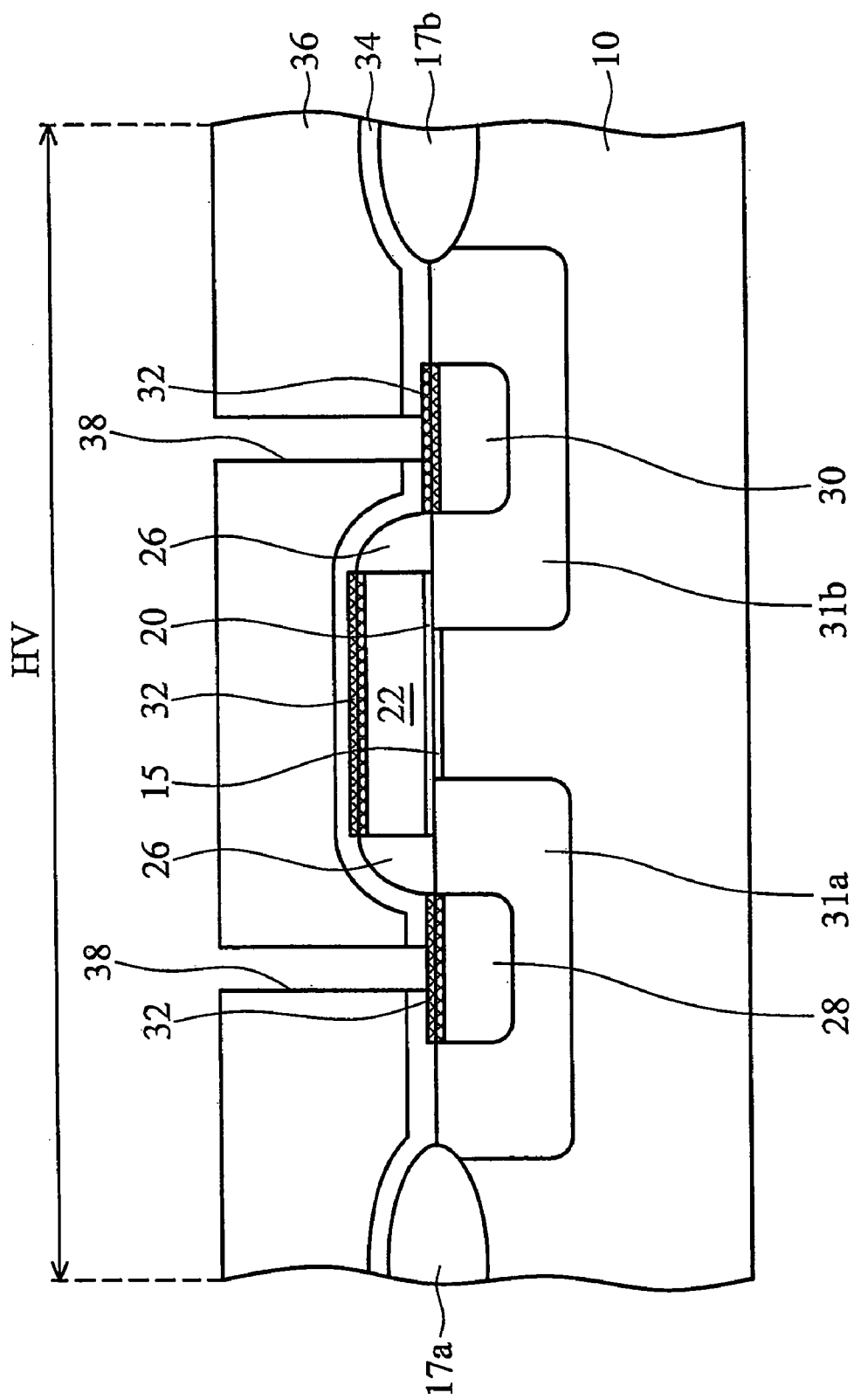
FIG. 7 is a cross-sectional diagram illustrating an exemplary embodiment of a symmetric-type DDDMOS transistor according to the present invention.

FIG. 7 is a cross-sectional diagram illustrating an exemplary embodiment of a symmetric-type DDDMOS transistor according to the present invention, while explanation of the same or similar portions to the description in FIG. 6 will be omitted. Compared with the asymmetric-type DDDMOS transistor, the symmetric-type DDDMOS transistor comprises two separated diffusion extension regions 31a and 31b between the two field oxide regions 17a and 17b. The diffusion extension region 31a, adjacent to the source side of the gate structure, surrounds the source region 28 to construct a double diffused source region. Symmetrically, the diffusion extension region 31b, adjacent to the drain side of the gate structure, surrounds the drain region 30 to construct a double diffused drain region.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
   a gate structure overlying a high-voltage device region of a semiconductor substrate;
   at least one diffusion region formed in said high-voltage region of said semiconductor substrate and laterally adjacent to the sidewall of said gate structure;
   an etch stop layer overlying and contacting said gate structure and overlying and contacting said at least one diffusion region, wherein said etch stop layer has a resistivity greater than 10 ohm-cm; and
   an interlayer dielectric layer overlying said etch stop layer and having at least one contact hole that penetrates said interlayer dielectric layer and said etch stop layer.

2. The semiconductor device of claim 1, wherein said etch stop layer is selected from any dielectric material other than a silicon oxynitride material that has a silicon molar percentage greater than about 55%.

3. The semiconductor device of claim 1, wherein said etch stop layer comprises a silicon nitride layer.

4. The semiconductor device of claim 1, wherein said etch stop layer comprises a silicon oxide layer and a silicon nitride layer.

5. The semiconductor device of claim 1, wherein said etch stop layer comprises a silicon oxynitride layer that has a silicon molar percentage less than about 55%.

6. The semiconductor device of claim 1, further comprising a metal silicide layer overlying said at least one diffusion region, wherein said at least one contact hole penetrates said interlayer dielectric layer and said etch stop layer to expose said metal silicide layer.

7. The semiconductor device of claim 1, further comprising two isolation regions formed in said semiconductor substrate to define said high-voltage device region.

8. The semiconductor device of claim 1, wherein said gate structure comprises:
   a gate dielectric layer overlying said semiconductor substrate; and
   a gate electrode layer overlying said gate dielectric layer.

9. The semiconductor device of claim 8, wherein said gate structure comprises:
   a dielectric spacer formed on the sidewall of said gate dielectric layer and said gate electrode layer; and
   wherein said diffusion region is substantially aligned to an exterior sidewall of said dielectric spacer.

10. The semiconductor device of claim 1, wherein said at least one contact hole is filled with a conductive material that is electrically connected to said at least one diffusion region.

11. The semiconductor device of claim 1, wherein said semiconductor device is a high-voltage transistor operating at a power supply voltage greater than 5V.

* * * * *

UNITED STATES PATENT AND TRADEMARK OFFICE
CERTIFICATE OF CORRECTION

PATENT NO.       : 7,301,185 B2  Page 1 of 1
APPLICATION NO.  : 10/999508
DATED            : November 27, 2007
INVENTOR(S)      : Chen et al.

It is certified that error appears in the above-identified patent and that said Letters Patent is hereby corrected as shown below:

On the Title Page, item (75) Inventors:, last entry, delete "Cheng," and insert --Chang,--.
In Col. 1, line 51 delete "(WLD)" and insert --(ILD)--.
In Col. 5, line 59, delete "ion/cm" and insert --ion/cm$^2$--.

Signed and Sealed this

Twenty-ninth Day of April, 2008

JON W. DUDAS
*Director of the United States Patent and Trademark Office*